United States Patent
Hsieh et al.

(10) Patent No.: US 9,577,202 B2
(45) Date of Patent: Feb. 21, 2017

(54) FLEXIBLE DISPLAY SUBSTRATE MOTHER BOARD AND METHOD OF MANUFACTURING FLEXIBLE DISPLAY SUBSTRATE

(71) Applicant: BOE TECHNOLOGY GROUP CO., LTD., Beijing (CN)

(72) Inventors: Ming Che Hsieh, Beijing (CN); Chunyan Xie, Beijing (CN); Lu Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 4 days.

(21) Appl. No.: 14/437,180

(22) PCT Filed: Aug. 11, 2014

(86) PCT No.: PCT/CN2014/084087
§ 371 (c)(1),
(2) Date: Apr. 20, 2015

(87) PCT Pub. No.: WO2015/127762
PCT Pub. Date: Sep. 3, 2015

(65) Prior Publication Data
US 2016/0049601 A1   Feb. 18, 2016

(30) Foreign Application Priority Data
Feb. 28, 2014   (CN) .......................... 2014 1 0073857

(51) Int. Cl.
*H01L 51/00* (2006.01)
*H01L 51/52* (2006.01)
(Continued)

(52) U.S. Cl.
CPC ........ *H01L 51/0097* (2013.01); *G02F 1/1368* (2013.01); *G02F 1/133305* (2013.01);
(Continued)

(58) Field of Classification Search
CPC ... H01L 21/78; H01L 51/529; H01L 51/0097; H01L 27/1262; H01L 27/1218;
(Continued)

(56) References Cited

U.S. PATENT DOCUMENTS

| 2004/0035840 A1* | 2/2004 | Koopmans ............ H01L 23/345 219/209 |
| 2012/0100647 A1* | 4/2012 | Kim ...................... H01L 51/003 438/28 |

(Continued)

FOREIGN PATENT DOCUMENTS

| CN | 101510020 B * | 9/2010 |
| CN | 102683379 A | 9/2012 |

(Continued)

OTHER PUBLICATIONS

Nov. 26, 2014—International Search Report for Appn PCT/CN2014/084087 with Eng Tran of Written Opinion.
(Continued)

*Primary Examiner* — Timothy Thompson
*Assistant Examiner* — Charles Pizzuto
(74) *Attorney, Agent, or Firm* — Banner & Witcoff, Ltd.

(57) ABSTRACT

A flexible display substrate mother board and a method of manufacturing a flexible display substrate are provided. The method includes: forming a heating pattern layer on a support substrate, wherein the heating pattern layer includes a plurality of regional blocks spaced apart from each other; forming a flexible substrate on the substrate provided with the heating pattern layer, and forming display elements on the flexible substrate; and heating the flexible substrate by utilization of the heating pattern layer, cutting the flexible substrate, stripping the flexible substrate corresponding to the regional block from the support substrate, and forming flexible display substrates. The method can avoid the dam- (Continued)

age of the display elements on the flexible substrate when the flexible substrate and the support substrate are separated from each other, and avoid uneven separation.

20 Claims, 4 Drawing Sheets

(51) Int. Cl.
  *H01L 51/56* (2006.01)
  *H01L 27/12* (2006.01)
  *H01L 27/32* (2006.01)
  *G02F 1/1335* (2006.01)
  *G02F 1/1333* (2006.01)
  *G02F 1/1368* (2006.01)
  *H01L 21/78* (2006.01)
  *H01L 29/786* (2006.01)

(52) U.S. Cl.
  CPC ........ *G02F 1/133514* (2013.01); *H01L 21/78* (2013.01); *H01L 27/12* (2013.01); *H01L 27/1218* (2013.01); *H01L 27/1262* (2013.01); *H01L 27/3244* (2013.01); *H01L 29/78603* (2013.01); *H01L 51/529* (2013.01); *H01L 51/56* (2013.01); *H01L 27/32* (2013.01); *H01L 2227/323* (2013.01); *H01L 2251/5338* (2013.01)

(58) Field of Classification Search
  CPC ............... H01L 51/56; H01L 29/78603; H01L 27/3244; H01L 27/12; H01L 2251/5338; H01L 27/32; H01L 2227/323; G02F 1/133514; G02F 1/133305; G02F 1/1368
  USPC .................. 257/40, 72, 88; 438/151, 27, 28
  See application file for complete search history.

(56) References Cited

U.S. PATENT DOCUMENTS

2012/0228617 A1\* 9/2012 Ko ...................... H01L 51/0097
  257/59
2014/0361004 A1\* 12/2014 Jang .................... H05B 1/0294
  219/494

FOREIGN PATENT DOCUMENTS

| CN | 103681486 A | 3/2014 |
| CN | 103682177 A | 3/2014 |
| CN | 103855171 A | 6/2014 |
| CN | 203812880 U | 9/2014 |

OTHER PUBLICATIONS

May 7, 2015—(CN)—First Office Action for Appn 201410073857.6 with Eng Tran.
Dec. 1, 2015—(CN)—Second Office Action 201410073857.6 with English Tran.

\* cited by examiner

FLEXIBLE DISPLAY SUBSTRATE MOTHER BOARD AND METHOD OF MANUFACTURING FLEXIBLE DISPLAY SUBSTRATE

The application is a U.S. National Phase Entry of International Application No. PCT/CN2014/084087 filed on Aug. 11, 2014, designating the United States of America and claiming priority to Chinese Patent Application No. 201410073857.6 filed on Feb. 28, 2014. The present application claims priority to and the benefit of the above-identified applications and the above-identified applications are incorporated by reference herein in their entirety.

TECHNICAL FIELD

At least one embodiment of the present disclosure relates to a flexible display substrate mother board and a method of manufacturing a flexible display substrate.

BACKGROUND

Flexible display technology has developed rapidly in recent years, and hence the properties, from the screen size to the display quality, of flexible displays have achieved great progress. Cathode ray tubes (CRTs) on the verge of disappearance or today's popular liquid crystal displays (LCDs) essentially belong to rigid displays. Compared with rigid displays, the flexible displays have many advantages, such as impact resistance, shock resistance, light weight, small size and more convenient for carrying.

Typically, there are three types of flexible displays: e-paper (flexible electrophoretic display), flexible organic light-emitting diodes (OLEDs) and flexible LCDs. The method of manufacturing a display substrate of the flexible display typically includes: forming a flexible substrate on a support substrate; then, forming film layers of a display structure; and finally, stripping the flexible substrate from the rigid support substrate by laser irradiation.

SUMMARY

At least one embodiment of the present disclosure provides a flexible display substrate mother board and a method of manufacturing a flexible display substrate to avoid the damage of display elements on a flexible substrate when the flexible substrate and a support substrate are separated from each other and avoid uneven separation.

In an aspect, at least one embodiment of the present disclosure provides a flexible display substrate mother board, which includes: a support substrate; a heating pattern layer provided on the support substrate and provided with a plurality of regional blocks spaced apart from each other; and a flexible substrate provided on the heating pattern layer, and display elements provided on the flexible substrate.

In another aspect, at least one embodiment of the present disclosure provides a method of manufacturing a flexible display substrate, which includes: forming a heating pattern layer on a support substrate, wherein the heating pattern layer includes a plurality of regional blocks spaced apart from each other; forming a flexible substrate on the substrate provided with the heating pattern layer, and forming display elements on the flexible substrate; and heating the flexible substrate by utilization of the heating pattern layer, cutting the flexible substrate, stripping the flexible substrate corresponding to the regional blocks from the support substrate and the heating pattern layer, and forming flexible display substrates.

BRIEF DESCRIPTION OF THE DRAWINGS

Simple description will be given below to the accompanying drawings of the embodiments to provide a more clear understanding of the technical solutions of the embodiments of the present disclosure. Apparently, the drawings described below only relates to some embodiments of the present disclosure but are not intended to limit the present disclosure.

Figure 1:
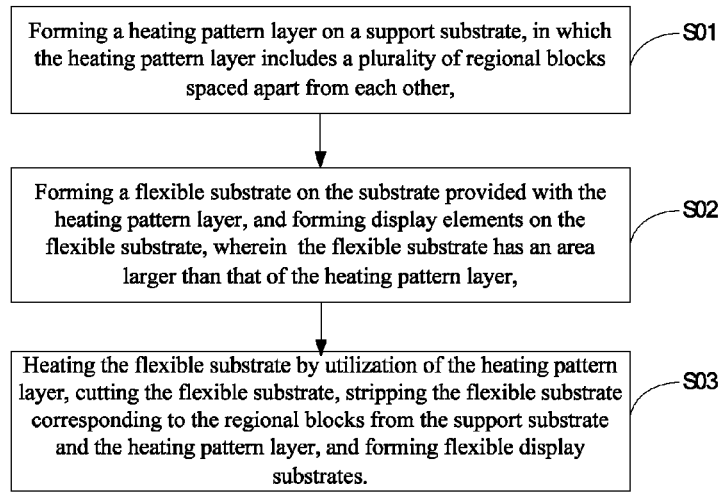
FIG. 1 is a flowchart of a method of manufacturing a flexible display substrate provided by an embodiment of the present disclosure.

Reference numerals of the accompanying drawings:
01-Flexible Display Substrate Mother Board; 10-Support Substrate; 20-Regional Block; 21-Protrusion; 30-Flexible substrate; 40-Display Element; 401-Anode; 402-Cathode; 403-Organic Material Function Layer; 404-Thin Film Transistor (TFT); 405-Pixel Electrode; 406-Common Electrode; 4071-Red Photoresist; 4072-Green Photoresist; 4073-Blue Photoresist; 408-Black Matrix (BM); 50-Pixel Isolation Layer; 60-Flexible Encapsulation Layer.

DETAILED DESCRIPTION

To make objects, technical details and advantages of the embodiments of the disclosure apparent, the technical solutions of the embodiments will be described in a clearly and fully understandable way in connection with the drawings related to embodiments of the disclosure. Apparently, the described embodiments are just a part but not all of the embodiments of the disclosure. Based on the described embodiments herein, those skilled in the art can obtain other embodiment(s), without any inventive work, which shall fall within the protection scope of the present disclosure.

The inventor of the application notice that: when laser beams are used for stripping treatment, although the intensity and the focus depth of the laser beams could be controlled, since both a flexible substrate and pattern layers of display elements formed on the flexible substrate are very thin, the display elements can be inevitably damaged by the light of the laser beams. In addition, since the beam area of the laser beams is limited, the flexible substrate must be gradually stripped off from a rigid support substrate by moving the laser beams when stripping, which may lead to a phenomenon of uneven stripping of the flexible substrate and the support substrate.

At least one embodiment of the present disclosure provides a method of manufacturing a flexible display substrate. As illustrated in FIG. 1, the method includes the following steps.

S01: forming a heating pattern layer on a support substrate, in which the heating pattern layer includes a plurality of regional blocks spaced apart from each other.

S02: forming a flexible substrate on the substrate provided with the heating pattern layer, and forming display elements on the flexible substrate.

In an embodiment, the flexible substrate has an area greater than that of the heating pattern layer. Herein, when the heating pattern layer includes the plurality of regional blocks spaced apart from each other, since the area of each regional block is smaller compared with the area of the entire flexible substrate disposed on the heating pattern layer, heat can be uniformly applied to the flexible substrate on the regional block through each regional block, and hence the separation effect and the process parameters are more stable when the flexible substrate corresponding to each regional block and the support substrate are separated from each other. In addition, separation regions and non-separation regions of the flexible substrate may also be controlled by a patterning design of the regional blocks, so that the product design or the process can be handled easily.

In addition, since the area of the flexible substrate is greater than that of the heating pattern layer, namely flexible substrates which do not correspond to the regional blocks are still disposed on the support substrate after flexible substrates corresponding to the regional blocks are completely stripped off from the support substrate and the regional blocks, even the flexible substrates corresponding to the regional blocks and the support substrate are in a stripping state, for the convenience of subsequent processes, the stripped flexible substrates may also be embedded between the flexible substrates, which are not stripped off, on the support substrate, and hence the stripped flexible substrates will not fall off. At this point, the heating pattern layer and the flexible substrate are disposed on a same side of the support substrate.

S03: heating the flexible substrate by utilization of the heating pattern layer, cutting the flexible substrate, stripping the flexible substrate corresponding to the regional blocks from the support substrate and the heating pattern layer, and forming flexible display substrates.

Herein, the flexible substrate may be heated at first and then cut, or the flexible substrate may also be cut at first and then the cut flexible substrate is heated.

It should be noted that: firstly, since only the flexible substrate corresponding to the regional blocks is separated from the support substrate and the flexible substrate corresponding to an area between any two regional blocks still makes contact with the support substrate after the flexible substrate is heated by utilization of the heating pattern layer, the flexible substrate corresponding to the regional blocks can only be completely stripped off from the support substrate after the cutting process, and then the flexible display substrates can be formed.

For example, one regional block may correspond to at least one flexible display substrate to be formed. On this basis, if one regional block corresponds to a plurality of flexible display substrates, in the case of cutting, the cutting process may be performed within a peripheral region of the regional block at first and then performed within a region of an adjacent flexible display substrate. Thus, complete flexible display substrates can be formed finally.

In addition, in the embodiment of the present disclosure, before cutting and after the heating of the flexible substrate by utilization of the heating pattern layer, the mutual relation between the flexible substrate corresponding to the regional block and the support substrate is referred to as separation; and after cutting, the mutual relation between the flexible substrate corresponding to the regional block and the support substrate is referred to as stripping.

Secondly, it should be understood by those skilled in the art that: since complete flexible display substrates must be formed after the flexible substrates corresponding to the regional blocks are completely stripped off from the support substrate, the cutting process must be performed in a peripheral region without any devices, of the flexible substrate separated from the support substrate when cutting, and then individual and complete flexible display substrates can be obtained after cutting.

On this basis, in an embodiment, the cutting area may be set to include an area outside of corresponding flexible display substrate and inside of the regional block corresponding to the flexible display substrate.

For example, the area of any regional block must be slightly greater than the area of at least one corresponding flexible display substrate to be formed, so as to ensure that the flexible substrate of the flexible display substrate to be formed corresponding to the regional block is completely separated from the support substrate. Moreover, a certain cutting area can be reserved, and hence the integrity of cutting can be guaranteed.

Herein, any device includes a display element. When a peripheral drive circuit is also formed on the flexible substrate, any device also includes the peripheral drive circuit.

Thirdly, in the embodiment of the present disclosure, the number of the regional blocks is not limited and may be determined by the number of the flexible display substrates to be formed.

Fourthly, the display element illustrated in the embodiment of the present disclosure refers to an essential structure formed by pattern layers and configured to achieve corresponding display function as a minimum display unit of the flexible display substrate according to the type of the flexible display substrate. The flexible display substrate includes a plurality of display elements.

For example, when the flexible display substrate is an array substrate of a flexible liquid crystal display (LCD), as a minimum display unit of the array substrate, the display elements at least include a TFT and a pixel electrode and may further include a common electrode, etc. When the flexible display substrate is a color filter (CF) substrate of the flexible LCD, as a minimum display unit of the CF substrate, the display elements include a red CF, a green CF or a blue CF and a BM, etc. When the flexible display substrate is an array substrate of an organic light-emitting diode (OLED), as a minimum display unit of the array substrate, the display elements at least include a cathode, an anode and an organic material function layer.

Besides, the display elements may further include some necessary pattern layers, such as a protective layer, or some pattern layers additionally arranged for improving the display effect or overcoming some defects.

An embodiment of the present disclosure provides a method of manufacturing a flexible display substrate. The method includes: forming a heating pattern layer on a support substrate, wherein the heating pattern layer includes a plurality of regional blocks spaced apart from each other; forming a flexible substrate on the substrate provided with the heating pattern layer, and forming display elements on the flexible substrate; and heating the flexible substrate by utilization of the heating pattern layer, cutting the flexible substrate, stripping the flexible substrate corresponding to the regional blocks from the support substrate and the heating pattern layer, and forming the flexible display substrate. In an embodiment, the area of the flexible substrate is greater than that of the heating pattern layer.

The heat applied to the flexible substrate by the heating pattern layer may be controlled to allow the heat energy reaching the flexible substrate to only penetrate into a certain thickness of the bottom of the flexible substrate contact with the heating pattern layer, so as to avoid the damage of the display elements on the flexible substrate on the basis of the case that the bottom of the flexible substrate corresponding to the regional block of the heating pattern layer is separated from the support substrate due to thermal material decomposition. Moreover, energy consumption can be reduced.

In addition, when the heating pattern layer is heated, each regional block of the heating pattern layer may uniformly apply heat to the flexible substrate corresponding to the regional block, so that the flexible substrate corresponding to each regional block and the support substrate can achieve uniform separation. On this basis, since each regional block of the heating pattern layer is mutually independent, the flexible substrate corresponding to the regional block may be separated from the support substrate in sequence according to the block by heating any regional block, and hence the uneven separation in the case of large-area separation can be avoided.

Figure 2:
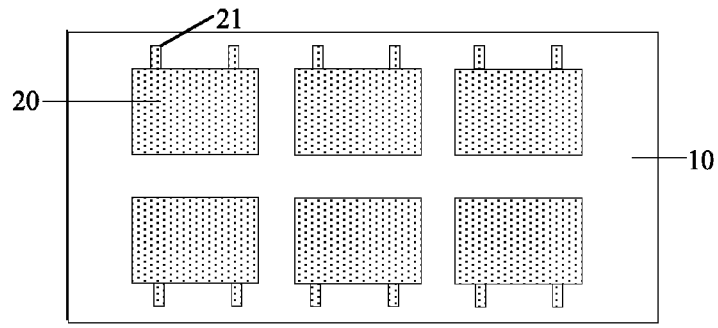
FIG. 2 is a schematic diagram 1 illustrating the process of forming regional blocks of a heating pattern layer on a support substrate provided by an embodiment of the present disclosure.
Figure 3:
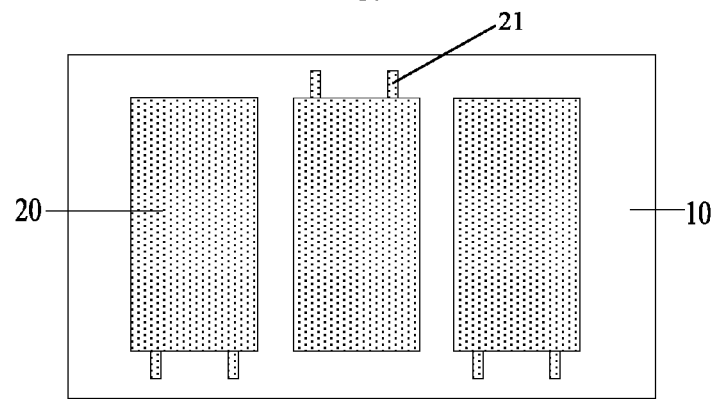
FIG. 3 is a schematic diagram 2 illustrating the process of forming the regional blocks of the heating pattern layer on the support substrate provided by an embodiment of the present disclosure.

In an embodiment, as described above, illustratively, the method of manufacturing the flexible display substrate may include the following steps:

S101: as illustrated in FIGS. 2 and 3, forming a heating pattern layer on a support substrate 10, and the heating pattern layer includes a plurality of regional blocks 20 spaced apart from each other.

For example, the regional blocks 20 may be made from material, such as metal, alloy and metal oxide.

Figure 4:
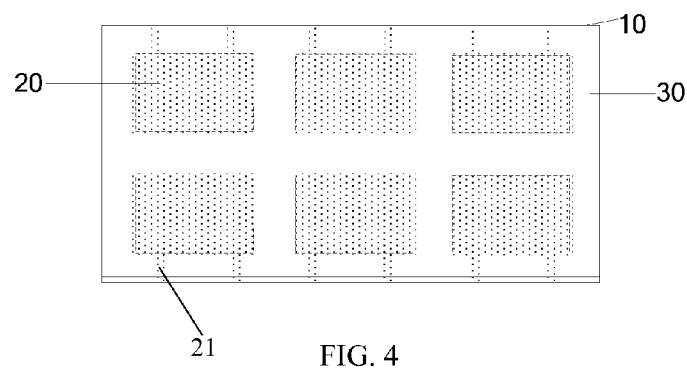
FIG. 4 is a schematic diagram 1 illustrating the corresponding relation between the regional blocks of the heating pattern layer and flexible display substrates to be formed in an embodiment of the present disclosure.
Figure 5:
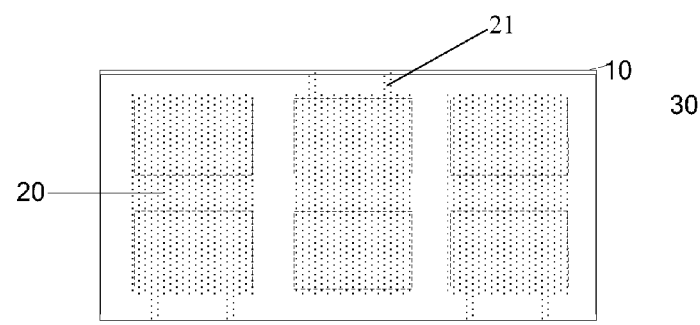
FIG. 5 is a schematic diagram 2 illustrating the corresponding relation between the regional blocks of the heating pattern layer and the flexible display substrates to be formed provided by an embodiment of the present disclosure.

S102: as illustrated in FIGS. 4 and 5, forming a flexible substrate 30 on the substrate provided with the heating pattern layer, and forming display elements (not shown in the figure) on the flexible substrate 30. In an embodiment, the heating pattern layer and the flexible substrate 30 are disposed on a same side of the support substrate 10. In an embodiment, the area of the flexible substrate 30 is greater than that of the heating pattern layer.

The flexible substrate 30 may be a plastic film which may be made from materials including at least one or a combination of more selected from polyimide, polycarbonate, polyacrylate and polyetherimide, for example. The forming way may be as follows: a film made from the above material is directly attached to the substrate provided with the heating pattern layer, or the material is coated on the substrate provided with the heating pattern layer, and then the flexible substrate 30 is formed. In addition, the flexible substrate 30 may be a single-layer film or a multilayer film structure.

S103: heating the flexible substrate 30 by utilization of the heating pattern layer, cutting the flexible substrate 30, stripping the flexible substrate 30 corresponding to the regional blocks 20 from the support substrate 10, and forming flexible display substrates.

The step may, for example, be as follows: generating Joule heat by applying a voltage to the regional blocks 20, applying the generated Joule heat to the flexible substrate 30 corresponding to the regional blocks 20, allowing the flexible substrate 30 corresponding to the regional blocks 20 to be separated from the support substrate 10, and forming flexible display substrates after cutting.

Herein, for example, a pulse voltage of 10 to 150V is applied to the regional block 20, and electrical energy is converted into thermal energy which is applied to the flexible substrate 30 corresponding to the regional block 20; under the action of the thermal energy applied to the flexible substrate 30, the adhesion of the flexible substrate 30 is reduced; and the flexible substrate 30 is separated from the support substrate 10 within a region corresponding to the regional block 20.

For example, the pulse voltage and the pulse time applied to the regional block 20 may be controlled in consideration of the heat penetration of the flexible substrate 30. That is to say, after the electrical energy is converted into the thermal energy, the thermal energy preferably only penetrates into the bottom of the flexible substrate 30 which contacts with the regional block 20. As such, the damage of the display elements due to the thermal energy applied to the flexible substrate 30 can be minimized.

In the step, the step of heating the flexible substrate 30 by utilization of the heating pattern layer may be achieved by the following ways: heating each portion of the flexible substrate 30 corresponding to each regional block in sequence by utilization of each regional block 20 of the heating pattern layer; or heating the flexible substrate 30 corresponding to all the regional blocks 20 at the same time by utilization of all the regional blocks 20 of the heating pattern layer; or dividing the heating pattern layer into several large pattern blocks at first, in which each large pattern block includes several above regional blocks 20; and heating each part of the flexible substrate 30 corresponding to each pattern block in sequence.

The foregoing only provides several preferred heating ways. Other heating ways are also applicable to the embodiment of the present disclosure. No limitation will be given here to the heating way.

In an embodiment, as illustrated in FIGS. 2 to 5, the heating pattern layer further includes two protrusions 21 connected with each regional block 20 and configured to provide a voltage to the regional block 20.

In the embodiment of the present disclosure, for any metal regional block 20, it is not limited to be connected with two protrusions 21 and may also be connected with more than two protrusions 21, and no limitation will be given here.

Herein, in an embodiment, the area of the flexible substrate 30 may be slightly smaller than that of the support substrate 10, namely the edge of the support substrate 10 is exposed. In this case, when two protrusions 21 are formed, the two protrusions 21 may be extended to the edge of the support substrate 10, namely are exposed to an area outside the flexible substrate 30. As such, a pulse voltage may be applied to the regional block 20 by allowing an external power source to direct contact with the two protrusions 21, for example.

Based on the above description, in an embodiment, as illustrated in FIGS. 2 and 3, the shape of any regional block 20 is rectangular. Since most display panels formed currently are all in a rectangular shape, the regional block 20 is configured to be rectangular to provide convenience for alignment in subsequent cutting process and hence can avoid damaging to the integrity of the flexible display.

In an embodiment, as illustrated in FIG. 4, any regional block 20 corresponds to a flexible display substrate with a predetermined size. The flexible display substrate includes the portion of the flexible substrate 30 corresponding to the regional block 20 and the display elements formed on the portion of the flexible substrate. As illustrated in FIG. 4, a closed dashed box corresponds to a flexible display substrate with a predetermined size.

In an embodiment, as illustrated in FIG. 5, any regional block 20 corresponds to two flexible display substrates with a predetermined size. The flexible display substrate includes partial flexible substrate 30 corresponding to the regional block 20 and the display elements formed on the flexible substrate. As illustrated in FIG. 5, a closed dashed box corresponds to two flexible display substrates with a predetermined size.

Any regional block 20 may also at least correspond to two flexible display substrates with a predetermined size, which can be set according to actual requirement.

Based on the above description, the step of forming the display elements on the flexible substrate 30, for example, may includes the following cases.

Figure 6:
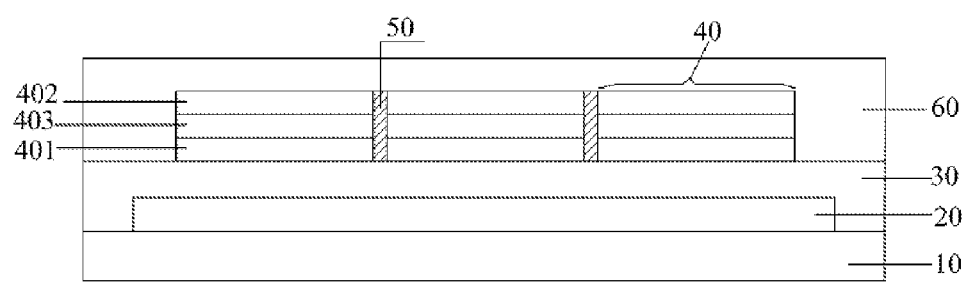
FIG. 6 is a schematic structural view of a flexible passive OLED display panel provided by an embodiment of the present disclosure.

First case: as illustrated in FIG. 6, when the manufactured flexible display substrate is a flexible passive OLED display panel, an anode 401, a cathode 402 and an organic material function layer 403 are formed on the flexible substrate 30. On this basis, a flexible encapsulation layer 60 is also formed. The organic material function layer 403 may at least include an electron transport layer (ETL), an emission layer (EML) and a hole transport layer (HTL). In order to improve the efficiency of the injection of electrons and holes into the EML, in an embodiment, the organic material function layer 403 may further include an electron injection layer (EIL) disposed between the cathode 402 and the ETL and a hole injection layer (HIL) disposed between the anode 401 and the HTL.

In FIG. 6, a display element 40 includes any anode 401, a cathode 402 corresponding to the anode 401, and an organic material function layer 403 disposed between the anode 401 and the cathode 402. In addition, as illustrated in FIG. 6, a pixel isolation layer 50 may be disposed between any two adjacent display elements 40 to isolate the display elements 40.

Figure 7:
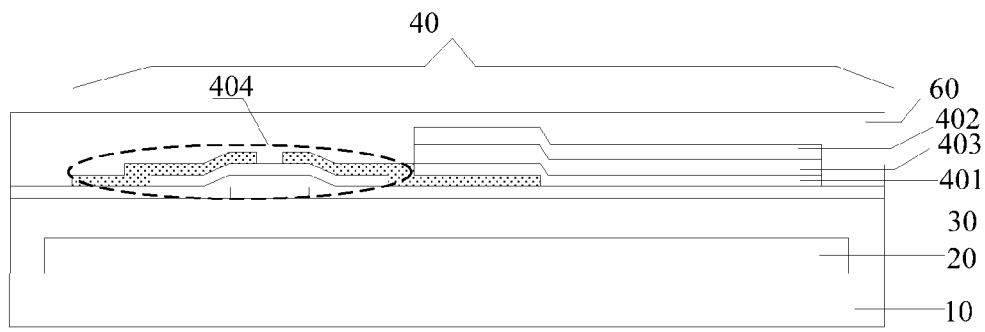
FIG. 7 is a schematic structural view of a flexible active OLED display panel provided by an embodiment of the present disclosure.

Second case: as illustrated in FIG. 7, when the manufactured flexible display substrate is a flexible active OLED display panel, a thin film transistor (TFT) 404, an anode 401, a cathode 402, and an organic material function layer 403 disposed between the anode 401 and the cathode 402 are formed on the flexible substrate 30. On this basis, a flexible encapsulation layer 60 is also formed. The TFT 404 includes a gate electrode, a gate insulating layer, an active layer, a source electrode and a drain electrode. The drain electrode is electrically connected with the anode 401.

In FIG. 7, a display element 40 includes any TFT 404, an anode 401 electrically connected with a drain electrode of the TFT 404, a cathode 402 corresponding to the anode 401, and an organic material function layer 403 disposed between the anode 401 and the cathode 402. A pixel isolation layer 50 may also be disposed between any two adjacent display elements 40 to isolate the display elements 40.

Herein, the TFT is a semiconductor unit with switching characteristic, for example, it may be an amorphous silicon (a-Si) TFT, a low-temperature polycrystalline silicon (LTPS) TFT, an oxide TFT or an organic TFT, and no limitation will be given here. On this basis, the TFT may be a top-gate type, or a bottom-gate type.

It should be noted that: firstly, for the first case and the second case, the forming sequence of the anode 401 and the cathode 402 is not limited; the anode 401 may be formed at first and then the organic material function layer 403 is formed, and then the cathode 402 is formed; or the cathode 402 may be formed at first and then the organic material function layer 403 is formed, and then the anode 401 is formed. Secondly, for the first case and the second case, due to the particularity of materials in the OLED, the step of heating the flexible substrate by utilization of the heating pattern layer and cutting the flexible substrate is performed after the display elements 40, the necessary pattern layers and the encapsulation layer are all formed. Thirdly, when light emitted by the organic material function layer 403 is white light, the OLED display panel may further include a CF structure, which can be configured according to actual requirement, and no further description will be given here.

Figure 8A:
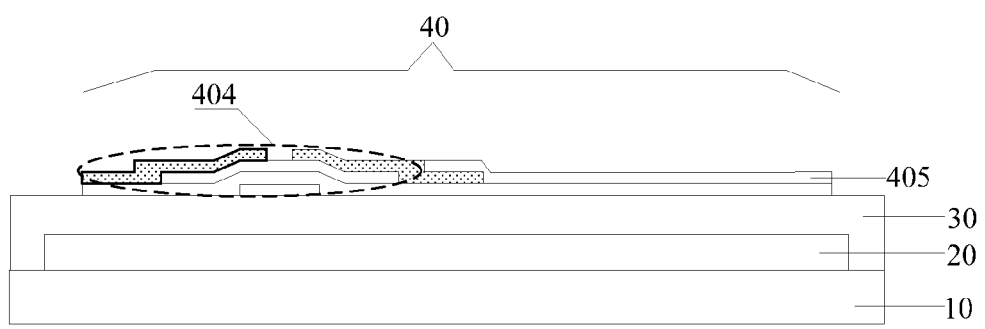
FIG. 8a is a schematic structural view 1 of a flexible LCD array substrate provided by an embodiment of the present disclosure.
Figure 8B:
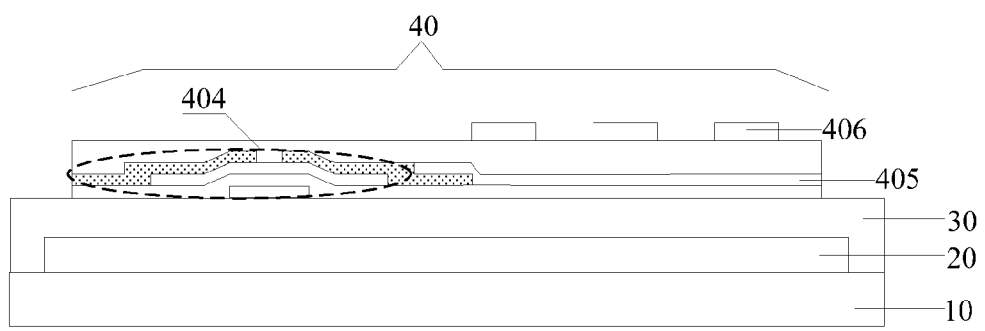
FIG. 8b is a schematic structural view 2 of the flexible LCD array substrate provided by the embodiment of the present disclosure.

Third case: as illustrated in FIG. 8a, when the manufactured flexible display substrate is a flexible LCD array substrate, a TFT 404 and a pixel electrode 405 electrically connected with a drain electrode of the TFT 404 are formed on the flexible substrate. As illustrated in FIG. 8b, a common electrode 406 may also be formed.

In FIGS. 8a and 8b, a display element 40 includes any TFT 404 and a pixel electrode 405 electrically connected with a drain electrode of the TFT 404. When the common electrode 406 is also formed on the array substrate, a display element 40 includes any TFT 404, a pixel electrode 405 electrically connected with a drain electrode of the TFT 404, and the common electrode 406 corresponding to the pixel electrode 405.

Figure 9:
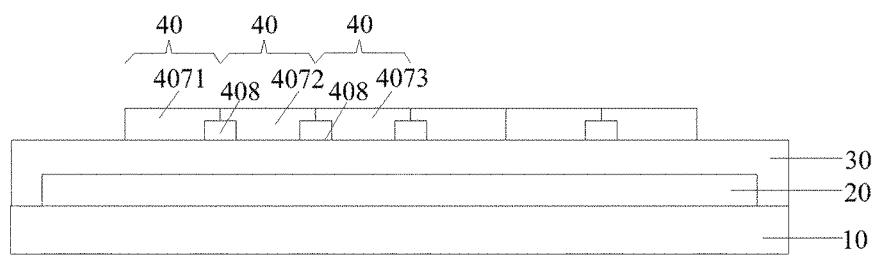
FIG. 9 is a schematic structural view of a color filter (CF) substrate of a flexible LCD provided by an embodiment of the present disclosure.

Fourth case: as illustrated in FIG. 9, when the manufactured flexible display substrate is a flexible LCD CF substrate, a color layer and BM 408 are formed on the flexible substrate 30. A common electrode 406 (not shown in FIG. 9) may also be formed. The color layer includes a red photoresist 4071, a green photoresist 4072 and a blue photoresist 4073, and may further include a white photoresist.

In FIG. 9, a display element 40 includes a photoresist of any color and BM 408 on the periphery of the photoresist.

It should be noted that: for the third case and the fourth case, after the display elements are formed, the array substrate and the CF substrate may be heated and cut at first and then subjected to cell assembly; or the array substrate and the CF substrate may also be directly subjected to cell assembly after the display elements are formed, and then an LCD panel obtained after cell assembly is subjected to a heating, a cutting and a stripping process.

In addition, an electrophoretic display unit may also be formed on the flexible substrate 30, which can be disposed according to actual requirement and no further description will be given here.

On this basis, considering the surface roughness of the flexible substrate 30 tends to be greater than that of a support substrate, such as a glass base substrate, in the case of bending, film layers on the flexible substrate 30 tend to be broken or fall off due to the irregularity and the stress action of the surface of the flexible substrate 30. Thus, in an embodiment, film layers with strong adhesion may be formed on the flexible substrate 30 at first, and then display elements 40 are formed on the film layers. In such a way, not only the problem of roughness can be solved but also the breakage or falling of the film layers on the flexible substrate can be avoided.

In addition, it should be understood by those skilled in the art that all the accompanying drawings in the embodiments of the present disclosure are simple schematic diagrams illustrating the process of manufacturing the flexible display substrate, are only intended to clearly illustrate structures related to the invention points of the present disclosure, but other structures unrelated to the invention points of the present disclosure are not embodied in the accompanying drawings or only partial structures are embodied.

Figure 10:
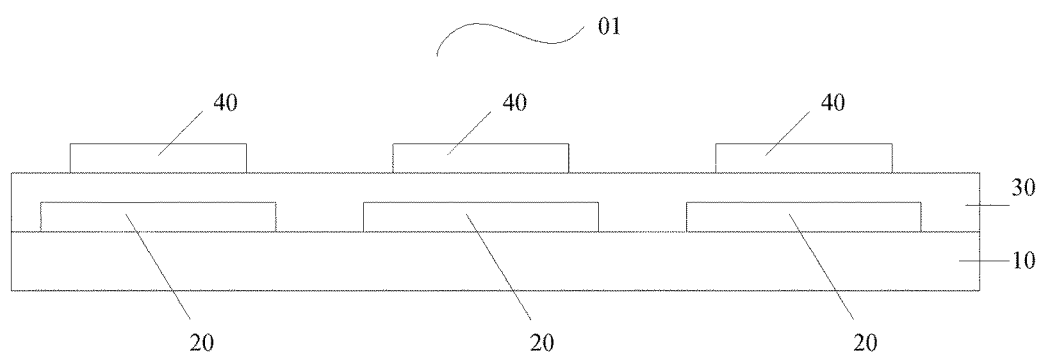
FIG. 10 is a schematic structural view of a flexible display substrate mother board provided by an embodiment of the present disclosure.

At least one embodiment of the present disclosure provides a flexible display substrate mother board 01. As illustrated in FIG. 10, the flexible display substrate mother board 01 includes a support substrate 10; a heating pattern layer disposed on the support substrate 10 and provided with a plurality of regional blocks 20 spaced apart from each other; and a flexible substrate 30 disposed on the heating pattern layer and display elements 40 disposed on the flexible substrate 30. In an embodiment, the area of the flexible substrate 30 is greater than that of the heating pattern layer.

It should be noted that: firstly, in the flexible display substrate mother board 01 provided by the embodiment of the present disclosure, the flexible substrate 30 corresponding to the regional blocks 20 of the heating pattern layer can only be completely stripped off from the support substrate 10 after the flexible substrate 30 is heated by utilization of the heating pattern layer and cut, and then flexible display substrates can be formed. That is to say, the flexible display substrate includes partial or all the flexible substrate 30 corresponding to the regional blocks 20 and the display elements 40 disposed on the flexible substrate 30.

On this basis, since the flexible substrate 30 must be completely stripped off from the support substrate 10 in the process of forming the flexible display substrate, for the flexible display substrate mother board 01, the flexible substrate 30 disposed in a specific region on the regional block 20 and the display elements disposed on the flexible substrate 30 are referred to as a flexible display substrate to be formed. Herein, in different embodiments, one regional block 20 may correspond to at least one flexible display substrate to be formed.

Secondly, FIG. 10 is only a schematic structural view of the flexible display substrate mother board 01 and only intended to illustrate that the flexible display substrate mother board 01 includes a plurality of flexible display substrates to be formed and each flexible display substrate to be formed includes a portion of the flexible substrate 30 corresponding to the regional block 20 and all the display elements 40 disposed on the substrate. In FIG. 10, only one display element 40 is simply used to represent all the display elements 40.

Thirdly, the display element 40 illustrated in the embodiment of the present disclosure refers to an essential structure formed by pattern layers and configured to achieve corresponding display function as a minimum display unit of the flexible display substrate according to the type of the flexible display substrate. The flexible display substrate includes a plurality of display elements 40.

For example, as illustrated in FIG. 8a, when the flexible display substrate is an LCD array substrate, as a minimum display unit of the array substrate, the display element 40 at least includes a TFT 404 and a pixel electrode 405, and it may further include a common electrode 406 and the like as shown in FIG. 8b. When the flexible display substrate is an LCD CF substrate, as a minimum display unit of the CF substrate, the display element 40 includes a red photoresist 4071, a green photoresist 4072 or a blue photoresist 4073 and a BM 408 and the like as shown in FIG. 9. When the flexible display substrate is an OLED array substrate, as a minimum display unit of the array substrate, the display element 40 at least includes an anode 401, a cathode 402 and an organic material function layer 403 as shown in FIGS. 6 and 7. Apart from this, the display element may further include some necessary pattern layers, such as a protective layer, or some pattern layers additionally arranged for improving the display effect or overcoming some defects.

At least one embodiment of the present disclosure provides a flexible display substrate mother board 01, which includes a support substrate 10; a heating pattern layer disposed on the support substrate 10 and provided with a plurality of regional blocks 20 spaced apart from each other; and a flexible substrate 30 disposed on the heating pattern layer and display elements 40 disposed on the flexible substrate 30. In an embodiment, the area of the flexible substrate 30 is greater than that of the heating pattern layer.

In the flexible display substrate mother board 01 provided by the embodiment of the present disclosure, the heat applied to the flexible substrate 30 by the heating pattern layer may be controlled to allow the heat energy reaching the flexible substrate 30 to only penetrate into a certain thickness of the bottom of the flexible substrate 30 which contact with the heating pattern layer, so as to avoid the damage of the display elements 40 on the flexible substrate 30 on the basis of the case that the bottom of the flexible substrate 30 corresponding to the regional block 20 of the heating pattern layer is separated from the support substrate 10 due to thermal material decomposition. Moreover, energy consumption can be reduced.

In addition, when the heating pattern layer is heated, each regional block 20 of the heating pattern layer may uniformly apply heat to a portion of the flexible substrate 30 corresponding to the regional block 20, so that the portion of the flexible substrate 30 corresponding to each regional block 20 and the support substrate 10 can achieve uniform separation. On this basis, since each regional block 20 of the heating pattern layer is mutually independent, the separation process may be performed by heating any regional block 20, namely the flexible substrate 30 corresponding to the regional block 20 may be separated from the support substrate 10 in part or small area at first, and then flexible display substrates are formed by cutting the part or small area of the flexible substrate 30. Thus, the uneven separation in the case of large-area separation can be avoided.

In an embodiment, as illustrated in FIGS. 2 to 5, the heating pattern layer may further include two protrusions 21 connected with each regional block 20 and configured to provide a voltage to the regional block.

In the embodiment of the present disclosure, any regional block 20 is not limited to be connected with two protrusions 21 and may also be connected with more than two protrusions 21, and no limitation will be given here.

Herein, in an embodiment, the area of the flexible substrate 30 may be slightly smaller than that of the support substrate 10, namely the edge of the support substrate 10 is exposed. In such a way, when the two protrusions 21 are formed, the two protrusions 21 may be extended to the edge of the support substrate 10, namely they are exposed outside of the flexible substrate 30. Thus, a voltage may be applied to the regional block 20 by allowing an external power source to direct contact with the two protrusions 21.

In an embodiment, the heating pattern layer is made from materials including at least one or a combination of more selected from metal, alloy and metal oxide.

Based on the above description, in an embodiment, as illustrated in FIGS. 2 and 3, the shape of any regional block 20 is rectangular. Since most display panels formed currently are all rectangular, the regional block 20 is configured to be rectangular to provide convenience for the alignment in subsequent cutting process and avoid the damage of the integrity of flexible display.

In an embodiment, as illustrated in FIG. 4, any regional block 20 corresponds to a flexible display substrate with a predetermined size to be formed. The flexible display substrate includes the flexible substrate 30 corresponding to the regional block 20 and the display elements 40 disposed on the flexible substrate. As illustrated in FIG. 4, a closed dashed box corresponds to a flexible display substrate with a predetermined size to be formed.

In an embodiment, as illustrated in FIG. 5, any regional block 20 corresponds to two flexible display substrates with a predetermined size to be formed. Each of the flexible display substrate includes a portion of the flexible substrate 30 corresponding to the regional block 20 and the display elements 40 disposed on the flexible substrate. As illustrated in FIG. 5, a closed dashed box corresponds to two flexible display substrates with a predetermined size to be formed.

Any regional block 20 may also at least correspond to more than two flexible display substrates with a predetermined size, which can be configured according to actual requirement.

On this basis, the step of forming the flexible display substrate to be formed may, for example, include the following cases.

First case: as illustrated in FIG. 6, when the flexible display substrate to be formed is a flexible passive OLED display panel, the flexible display substrate includes an anode 401, a cathode 402 and an organic material function layer 403 disposed between the anode 401 and the cathode 402, arranged on the flexible substrate 30. On this basis, a flexible encapsulation layer 60 is also formed. The organic material function layer 403 may at least include an ETL, an EML and an HTL. In order to improve the efficiency of the injection of electrons and holes into the EML, in an embodiment, the organic material function layer 403 may further include an EIL disposed between the cathode 402 and the ETL and an HIL disposed between the anode 401 and the HTL.

In FIG. 6, a display element 40 includes any anode 401, a cathode 402 corresponding to the anode 401, and an organic material function layer 403 disposed between the anode 401 and the cathode 402. In addition, as illustrated in FIG. 6, a pixel isolation layer 50 may be disposed between any two adjacent display elements to isolate the display elements 40.

Second case: as illustrated in FIG. 7, when the flexible display substrate to be formed is a flexible active OLED display panel, the flexible display substrate includes a TFT 404, an anode 401, a cathode 402, and an organic material function layer 403 disposed between the anode 401 and the cathode 402, arranged on the flexible substrate 30. On this basis, a flexible encapsulation layer 60 is also formed. The TFT 404 includes a gate electrode, a gate insulating layer, an active layer, a source electrode and a drain electrode. The drain electrode is electrically connected with the anode 401.

In FIG. 7, a display element 40 includes any TFT 404, an anode 401 electrically connected with a drain electrode of the TFT 404, a cathode 402 corresponding to the anode 401, and an organic material function layer 403 disposed between the anode 401 and the cathode 402. A pixel isolation layer 50 may also be disposed between any two adjacent display elements 40 to isolate the display elements 40.

Herein, the TFT is a semiconductor unit with switching characteristic, for example, may be an a-Si TFT, an LTPS TFT, an oxide TFT or an organic TFT. No limitation will be given here. On this basis, the TFT may be a top-gate type or a bottom-gate type of TFT.

It should be noted that: firstly, as for the first case and the second case, the forming sequence of the anode 401 and the cathode 402 is not limited; the anode 401 may be formed at first and then the organic material function layer 403 is formed, and then the cathode 402 is formed; or the cathode 402 may also be formed at first and then the organic material function layer 403 is formed, and then the anode 401 is formed. Secondly, as for the first case and the second case, due to the particularity of materials in the OLED, the step of heating the flexible substrate by utilization of the heating pattern layer and cutting the flexible substrate is performed after the display elements 40, the necessary pattern layers and the encapsulation layer are all formed. Thus, the OLED display panel includes the above film layers. Thirdly, when light emitted by the organic material function layer 403 is white light, the OLED display panel may further include a CF structure, which can be disposed according to actual requirement, and no further description will be given here.

Third case: as illustrated in FIG. 8a, when the flexible display substrate to be formed is a flexible LCD array substrate, the flexible display substrate includes a TFT 404 disposed on the flexible substrate and a pixel electrode 405 electrically connected with a drain electrode of the TFT 404. As illustrated in FIG. 8b, the flexible display substrate may further include a common electrode 406.

In FIGS. 8a and 8b, a display element 40 includes any TFT 404 and a pixel electrode 405 electrically connected with a drain electrode of the TFT 404. When the array substrate further includes the common electrode 406, a display element 40 includes any TFT 404, a pixel electrode 405 electrically connected with a drain electrode of the TFT 404, and the common electrode 406 corresponding to the pixel electrode 405.

Fourth case: as illustrated in FIG. 9, when the flexible display substrate to be formed is a flexible LCD CF substrate, the flexible display substrate includes a color layer and a BM 408 disposed on the flexible substrate 30. The flexible display substrate may also include a common electrode 406. The color layer includes a red photoresist 4071, a green photoresist 4072 and a blue photoresist 4073, and may further include a white photoresist.

In FIG. 9, a display element 40 includes a photoresist of any color and a portion of the BM 408 on the periphery of the photoresist of the color.

It should be noted that: for the third case and the fourth case, after the display elements are formed, the array substrate and the CF substrate may be heated and cut at first and then subjected to cell assembly; or the array substrate and the CF substrate may also be directly subjected to cell assembly after the display elements are formed, and then an LCD panel obtained after cell assembly is subjected to a heating, a cutting and a stripping process. That is to say, the flexible display substrate to be formed may also be an LCD panel obtained after the cell assembly of an array substrate and a CF substrate of an LCD.

On this basis, considering the surface roughness of the flexible substrate 30 tends to be greater than that of a support substrate, such as a glass base substrate, in the case of bending, film layers on the flexible substrate 30 tend to be broken or fall off due to the irregularity and the stress action of the surface of the flexible substrate 30. Thus, in an embodiment, film layers with strong adhesion may be disposed adjacent to the flexible substrate 30, namely display elements 40 are disposed on the film layers, and then not only the problem of roughness can be solved but also the breakage or falling of the film layers on the flexible substrate can be avoided.

The descrbed above are only illustrative embodiments and implementations for explaining the present disclosure, and the present disclosure is not intended to be limited thereto. For one of ordinary skill in the art, various modifications and improvements may be made without departing from the spirit and scope of embodiments of the present disclosure, and all of which shall fall within the protection scope of the present disclosure. The scope protected by the present disclosure is defined by the appended claims.

The application claims priority to the Chinese patent application No. 201410073857.6 filed on Feb. 28, 2014. The disclosure content of the Chinese patent application is incorporated by reference herein as part of the application.

What is claimed:

1. A flexible display substrate mother board, comprising:
a support substrate;
a heating pattern layer provided on the support substrate and provided with a plurality of regional blocks spaced apart from each other; and
a flexible substrate provided on the heating pattern layer and display elements provided on the flexible substrate.

2. The mother board according to claim 1, wherein the flexible substrate has an area greater than that of the heating pattern layer.

3. The mother board according to claim 1, wherein the heating pattern layer further comprises at least two protrusions connected with each regional block; and the protrusions are configured to provide a voltage to the regional blocks.

4. The mother board according to claim 1, wherein the heating pattern layer is made from material including at least one or a combination of more selected from metal, alloy and metal oxide.

5. The mother board according to claim 1, wherein each of the plurality regional blocks corresponds to a flexible display substrate with a predetermined size to be formed; and the flexible display substrate includes a portion of the flexible substrate corresponding to the regional block and the display elements provided on the flexible substrate.

6. The mother board according to claim 1, wherein each of the plurality regional blocks corresponds to two or more than two flexible display substrates with a predetermined size to be formed; and each of the flexible display substrates includes a part of the flexible substrate corresponding to the regional block and the display elements provided on the flexible substrate.

7. The mother board according to claim 2, wherein the heating pattern layer further comprises at least two protrusions connected with each regional block; and the protrusions are configured to provide a voltage to the regional blocks.

8. The mother board according to claim 2, wherein the heating pattern layer is made from material including at least one or a combination of more selected from metal, alloy and metal oxide.

9. The mother board according to claim 3, wherein the heating pattern layer is made from material including at least one or a combination of more selected from metal, alloy and metal oxide.

10. The mother board according to claim 2, wherein each of the plurality regional blocks corresponds to a flexible display substrate with a predetermined size to be formed; and the flexible display substrate includes a portion of the flexible substrate corresponding to the regional block and the display elements provided on the flexible substrate.

11. The mother board according to claim 3, wherein each of the plurality regional blocks corresponds to a flexible display substrate with a predetermined size to be formed; and the flexible display substrate includes a portion of the flexible substrate corresponding to the regional block and the display elements provided on the flexible substrate.

12. The mother board according to claim 2, wherein each of the plurality regional blocks corresponds to two or more than two flexible display substrates with a predetermined size to be formed; and each of the flexible display substrates includes a part of the flexible substrate corresponding to the regional block and the display elements provided on the flexible substrate.

13. A method of manufacturing a flexible display substrate, comprising steps of:
forming a heating pattern layer on a support substrate, wherein the heating pattern layer includes a plurality of regional blocks spaced apart from each other;
forming a flexible substrate on the substrate provided with the heating pattern layer, and forming display elements on the flexible substrate; and
heating the flexible substrate by utilization of the heating pattern layer, cutting the flexible substrate, stripping a portion of the flexible substrate corresponding to each regional block from the support substrate and the heating pattern layer, and forming flexible display substrates.

14. The method according to claim 13, wherein the flexible substrate has an area greater than that of the heating pattern layer.

15. The method according to claim 13, wherein the step of heating the flexible substrate by utilization of the heating pattern layer comprises:
heating the portion of the flexible substrate corresponding to each regional block in sequence by utilization of each regional block of the heating pattern layer; or
heating the flexible substrate corresponding to all the regional blocks at the same time by utilization of all the regional blocks of the heating pattern layer; or
dividing the heating pattern layer into a plurality of large pattern blocks at first, wherein each large pattern block includes a plurality of regional blocks; and then heating a part of the flexible substrate corresponding to each pattern block in sequence.

16. The method according to claim 13, wherein the step of heating the flexible substrate by utilization of the heating pattern layer comprises:
generating Joule heat by applying a voltage to the regional block, and applying the generated Joule heat to the flexible substrate corresponding to the regional block.

17. The method according to claim 13, wherein the heating pattern layer further comprises at least two protrusions connected with each regional block; and the protrusions are configured to provide a voltage to the regional blocks.

18. The method according to claim 13, wherein each regional block corresponds to a flexible display substrate with a predetermined size; and the flexible display substrate includes the portion of the flexible substrate corresponding to the regional block and the display elements formed on the flexible substrate.

19. The method according to claim 13, wherein each regional block corresponds to two or more than two flexible display substrates with a predetermined size; and each of the flexible display substrates includes a part of the flexible substrate corresponding to the regional block and the display elements formed on the flexible substrate.

20. The method according to claim 13, wherein a cutting area includes an area outside of the flexible display substrate and inside of the regional block corresponding to the flexible display substrate.

* * * * *